(12) United States Patent
Staker et al.

(10) Patent No.: US 6,635,158 B1
(45) Date of Patent: Oct. 21, 2003

(54) ELECTRO CERAMIC MEMS STRUCTURE WITH CONTROLLED ACTUATOR GAP

(75) Inventors: Bryan P. Staker, Pleasanton, CA (US); Douglas L. Teeter, Jr., Mountain View, CA (US); David T. Amm, Kingston (CA)

(73) Assignee: Glimmerglass Networks, Inc., Hayward, CA (US)

( * ) Notice: Subject to any disclaimer, the term of this patent is extended or adjusted under 35 U.S.C. 154(b) by 270 days.

(21) Appl. No.: 09/919,569

(22) Filed: Jul. 30, 2001

(51) Int. Cl.[7] ............................................. C25D 17/00
(52) U.S. Cl. ........................... 204/242; 204/279; 205/78
(58) Field of Search ................................. 204/242, 279; 205/78

(56) References Cited

U.S. PATENT DOCUMENTS

| | | | |
|---|---|---|---|
| 4,370,215 A | * | 1/1983 | Frudd .......................... 204/242 |
| 5,441,622 A | * | 8/1995 | Langford ................. 204/275.1 X |
| 5,904,820 A | * | 5/1999 | Brown et al. ................. 204/225 |
| 6,379,510 B1 | * | 4/2002 | Kane ....................... 204/192.34 |
| 6,583,031 B2 | * | 6/2003 | Lin .............................. 438/459 |

* cited by examiner

Primary Examiner—Donald R. Valentine
(74) Attorney, Agent, or Firm—Townsend and Townsend and Crew LLP; Kenneth R. Allen

(57) ABSTRACT

In an array apparatus, each MEMS element, comprising an actuatable element and a supportive handle, is mounted over a plurality of electrodes wherein the air gap is controlled by the thickness of the electrodes and not primarily by the structure of the handle. The structure of electrostatic actuation electrodes in specific embodiments is disclosed. While the invention is primarily a technique for reducing the air gap without unduly limiting the thickness of the handle, the invention may also be used to establish an air gap greater than the thickness of the handle.

8 Claims, 2 Drawing Sheets

ELECTRO CERAMIC MEMS STRUCTURE WITH CONTROLLED ACTUATOR GAP

BACKGROUND OF THE INVENTION

This invention relates to electro ceramic components such as MEMS arrays and methods for fabricating electro ceramic components with high density interconnects so that variable controlled air gaps may be achieved with high accuracy. Components constructed according to the invention are microelectromechanical systems arrays or other micromachined elements.

Conventional MEMS array structures comprise Silicon on Insulator (SOI) array structures on which is fabricated an integrated electrode array. One of the problems encountered is precise control of the distance from the top surface of the electrostatic actuation electrodes and the bottom surface of the MEMS actuation element (hereafter referred,to as the air gap) during fabrication due to limitations of minimum wafer thickness of a SOI wafer where the air gap is nominally set by wafer thickness.

What is needed is a solution that allows for variable controlled air gaps which determine the operating characteristics of a MEMS device that does not compromise the SOI wafer integrity.

SUMMARY OF THE INVENTION

According to the invention, in an array apparatus, each MEMS element, comprising an actuatable element and a supportive handle, is mounted over a plurality of electrodes wherein the air gap is controlled by the thickness of the electrodes and not primarily by the structure of the handle. The structure of electrostatic actuation electrodes in specific embodiments is disclosed. While the invention is primarily a technique for reducing the air gap without unduly limiting the thickness of the handle, the invention may also be used to establish an air gap greater than the thickness of the handle.

The invention will be better understood by reference to the following detailed description in connection with the accompanying illustrations.

DESCRIPTION OF SPECIFIC EMBODIMENTS

Figure 1:
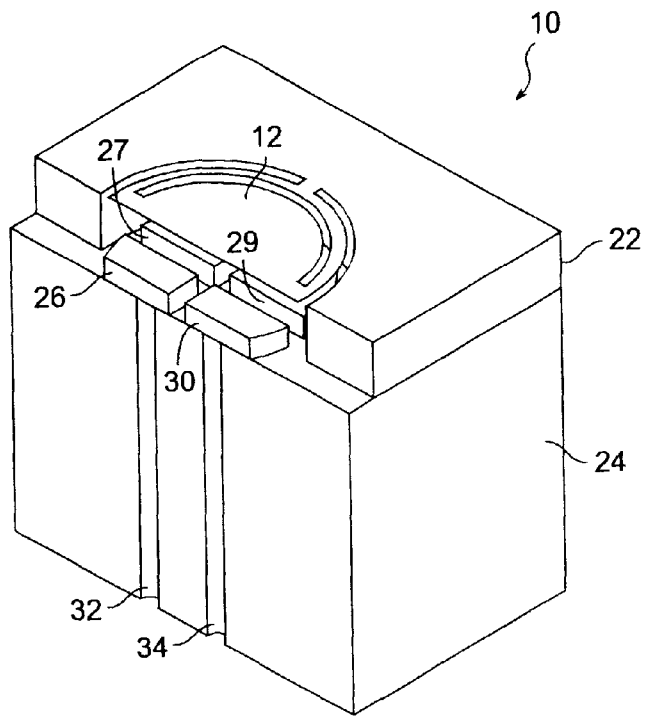
FIG. 1 is a perspective view in cutaway of a first embodiment according to the invention.

Reference is made to FIG. 1 in which is shown a single element of a MEMS array element 10 according to the invention, with a MEMS-based mirror 12 fabricated in an integrated Silicon on Insulator structure (SOI) 22 and mounted on a (ceramic) substrate 24. According to the invention, several adjacent electrodes 26–30 are mounted on or embedded in the substrate structure 24 with vias 32–34 to a control module (not shown). The structure is not specific to a particular material combination. The structure may be for example silicon mounted to ceramic, silicon to polyimide materials, silicon to FLEX circuit board materials, silicon to silicon, silicon to thick film on any substrate material, or silicon to thin film on any substrate material.

Electrodes 26–30 mounted directly on the substrate 24 are energized to actuate the mirror 12 through electrostatic force. The technique of construction according to the invention simplifies the fabrication and improves the construction yield of the mirrors by decoupling the control of the air gap size from control over the thickness of the MEMS structure 22.

Figure 2:
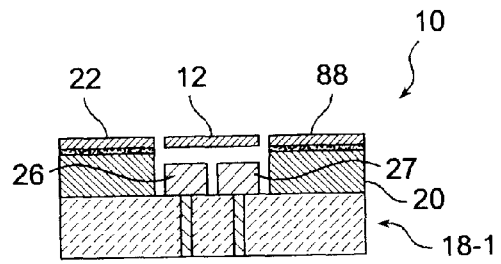
FIG. 2 is a side cross-sectional view of a single array element according to a first embodiment of the invention.

Referring to FIG. 2, the mirror 12 of the element 10 is positioned at a distance from the electrodes 26, 27 that is not determined or limited by the required mechanical thickness of the MEMS handle 20 of the MEMS structure 22. Rather the gap is determined by the thickness of the electrodes 26, 27 against the height of the handle. Thus, thicker handles 20 can be accommodated, allowing for larger MEMS arrays due to structural fragility. The structure is thus more readily scalable. In the embodiment of FIG. 2, the electrodes 26, 27 are constructed by electroforming, i.e., by depositing a seed metal at the position of the electrode and then promoting its growth by electroplating. This permits relatively thick electrodes to be formed.

Figure 3:
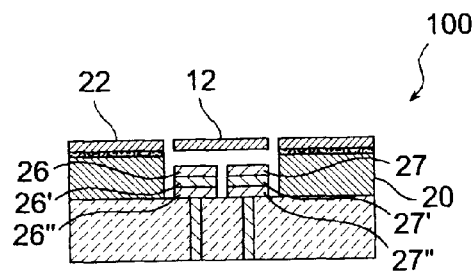
FIG. 3 is a side cross-sectional view of a single array element according to a second embodiment of the invention.

In FIG. 3, for thinner electrode structures, the electrodes 26, 27 of the element 100 may be formed in layers 26, 27; 26', 27'; 26",27" such as by multiple lithographic depositions or by multiple layer screen printing. The various deposition layers may be of differing conductive materials.

Figure 4:
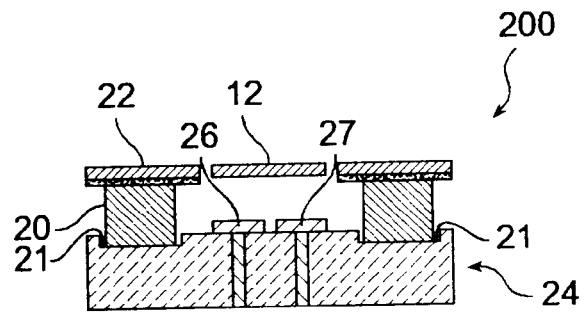
FIG. 4 is a side cross-sectional view of a single array element according to a third embodiment of the invention.

In FIG. 4, the element 200 may comprise a substrate 24 having wells etched out to receive the handle material 20 in lowered beds 21. The accuracy of control over thickness of both the handle 20 and the wells 21 is thus an issue. However, the benefit of the invention is the greater allowable thickness of the handle without the need to build up the electrodes.

Figure 5:
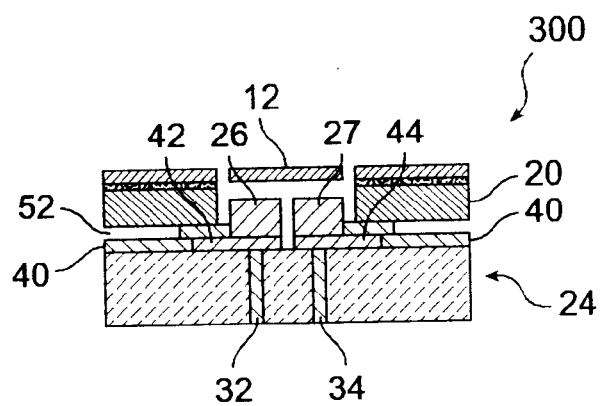
FIG. 5 is a side cross-sectional view of a single array element according to a fourth embodiment of the invention.

In FIG. 5, the handle 20 of an element 300 rests on a non-uniform dielectric layer 40, which in turn rests on the substrate 24 in some locations and on trace pads 42, 44 to which vias 32, 34 are coupled. Electrodes 26, 27 are built up by an appropriate deposition technique to define the mirror to electrode gap. The evident air gap 52 between the handle 20 and the dielectric 40 is not a significant cantilever since other traces (not shown) of an adjacent element (not shown) support the extension of the handle 20.

Figure 6:
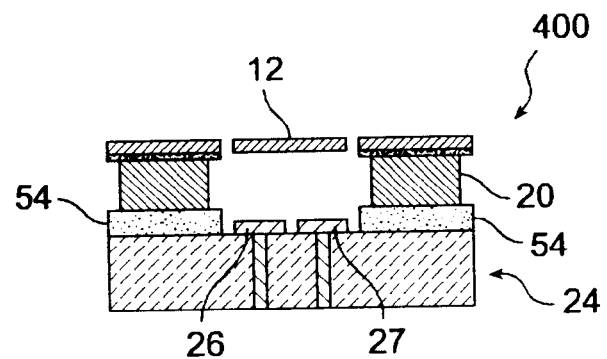
FIG. 6 is a side cross-sectional view of a single array element according to a fifth embodiment of the invention.

In FIG. 6, an element 400 has electrodes 26, 27 mounted on the substrate 24. An additional spacer 54 is provided adjacent the electrodes and under the handle 20 in order to provide a greater electrode to mirror gap than would be established by the thickness of the handle 20 alone. The spacer 54 is for example a screen printed dielectric or a dielectric deposition.

The invention has been explained with reference to specific embodiments. Other embodiments will be evident to those of ordinary skill in the art. Therefore, it is not intended that this invention be limited, except as indicated by the appended claims.

What is claimed is:

1. A microelectromechanical systems (MEMS) element comprising:
    a handle structure having a predetermined thickness;
    an actuatable element disposed at a cavity in said handle structure;
    a substrate mounted to said handle structure; and electrodes disposed on said substrate and aligned with said actuatable element, said electrodes being fabricated with a height calibrated to establish a gap with said actuatable element.

2. The element according to claim 1 wherein the electrodes are electro-formed.

3. The element according to claim 1 wherein the electrodes comprise at least one thick-film conductor deposition.

4. The element according to claim 1 wherein the electrodes comprise at least one thin-film deposition.

5. The element according to claim 1 wherein the electrodes comprise at least one screen-printed layer.

6. The element according to claim 1 wherein said substrate has trenches at the periphery of the cavity such the handle structure is recessed within the substrate and for narrowing the gap between the top surface of the electrodes and the bottom surface of the actuatable element without reducing the thickness of the handle structure.

7. The element according to claim 1 wherein traces coupled to said electrodes are disposed to extend beyond the cavity and wherein a dielectric layer is disposed over said traces, said electrodes being fabricated upon a portion of said traces with a height calibrated to establish a gap with said actuatable element.

8. The element according to claim 1 wherein a dielectric layer is disposed on said substrate and said handle structure is mounted to said dielectric layer wherein the gap between the top surface of the electrodes and the bottom surface of the actuatable elements is increased.

* * * * *